(12) United States Patent
Hobelsberger

(10) Patent No.: US 9,146,279 B2
(45) Date of Patent: Sep. 29, 2015

(54) METHOD FOR DETECTION OF INTERLAMINAR SHEET SHORT CIRCUITS IN THE STATOR SHEET CORE OF ELECTROMACHINES

(75) Inventor: Max Hobelsberger, Würenlingen (CH)

(73) Assignee: ALSTOM TECHNOLOGY LTD., Baden (CH)

( * ) Notice: Subject to any disclaimer, the term of this patent is extended or adjusted under 35 U.S.C. 154(b) by 343 days.

(21) Appl. No.: 12/793,852

(22) Filed: Jun. 4, 2010

(65) Prior Publication Data

US 2011/0012637 A1    Jan. 20, 2011

Related U.S. Application Data

(63) Continuation of application No. PCT/EP2008/065714, filed on Nov. 18, 2008.

(30) Foreign Application Priority Data

Dec. 7, 2007 (CH) ...................................... 1894/07

(51) Int. Cl.
*G01R 31/34* (2006.01)

(52) U.S. Cl.
CPC ...................................... *G01R 31/34* (2013.01)

(58) Field of Classification Search
CPC .................................................... H02P 29/021
USPC .................... 324/500, 537, 545–547, 765.01; 318/490; 322/99; 702/58, 183
See application file for complete search history.

(56) References Cited

U.S. PATENT DOCUMENTS 2,903,881 A * 9/1959 Frolow ........................... 73/1.46
4,573,012 A * 2/1986 Bisson et al. .................. 324/222
4,996,486 A * 2/1991 Posedel ......................... 324/545

(Continued)

FOREIGN PATENT DOCUMENTS

AT       390522 B      5/1990
CN      1038359 A     12/1989

(Continued)

OTHER PUBLICATIONS

Office Action, Chinese Patent Application No. 200880126171.1, dated Apr. 18, 2013.

*Primary Examiner* — Huy Q Phan
*Assistant Examiner* — Giovanni Astacio-Oquendo
(74) *Attorney, Agent, or Firm* — Buchanan Ingersoll & Rooney PC

(57) ABSTRACT

A method and an apparatus are described for detection of interlaminar laminate shorts in the laminated stator core of electrical machines, in which the laminated stator core (4) is subjected to an externally applied field current (2) or field voltage (V), and the short-circuit magnetic field ($B_{short}$) induced by short-circuit currents (5) is measured with the assistance of a sensor coil (S1) which is arranged in the gap in the machine and probes this gap. Improved identification of laminate shorts, in particular even of small laminate shorts with small short-circuit currents, is possible in that a field current (2) and a field voltage (V) are applied which have a waveform which differs significantly from a sinusoidal shape, in particular with a periodic character, and have significant harmonic components in the high frequency range. By way of example, a waveform in the form of a square-wave curve is proposed.

21 Claims, 4 Drawing Sheets

(56) References Cited

U.S. PATENT DOCUMENTS

| | | | |
|---|---|---|---|
| 5,455,498 A * | 10/1995 | Kakimoto et al. | 318/605 |
| 5,895,439 A * | 4/1999 | Fisher et al. | 702/36 |
| 6,091,236 A * | 7/2000 | Piety et al. | 324/103 P |
| 6,291,987 B1 * | 9/2001 | Dean et al. | 324/764.01 |
| 6,404,259 B1 * | 6/2002 | Busse | 327/293 |
| 6,469,504 B1 * | 10/2002 | Kliman et al. | 324/228 |
| 6,489,781 B1 * | 12/2002 | Kliman et al. | 324/545 |
| 6,714,020 B2 * | 3/2004 | Hobelsberger et al. | 324/525 |
| 6,754,610 B2 * | 6/2004 | Dudler et al. | 702/151 |
| 6,756,788 B2 * | 6/2004 | Kliman et al. | 324/545 |
| 6,791,351 B2 * | 9/2004 | Fischer et al. | 324/765.01 |
| 6,815,957 B2 * | 11/2004 | Hobelsberger et al. | 324/545 |
| 6,873,152 B2 * | 3/2005 | Kliman et al. | 324/241 |
| 6,903,556 B2 | 6/2005 | Sutton | |
| 6,906,556 B2 * | 6/2005 | Choe | 326/95 |
| 7,102,379 B2 * | 9/2006 | Hobelsberger et al. | 324/765.01 |
| 7,605,592 B2 * | 10/2009 | Baca et al. | 324/545 |
| 7,772,870 B2 * | 8/2010 | Inamura et al. | 324/765.01 |
| 8,310,272 B2 * | 11/2012 | Quarto | 324/765.01 |
| 8,378,645 B2 * | 2/2013 | Hobelsberger et al. | 322/99 |
| 8,536,839 B2 * | 9/2013 | Hobelsberger et al. | 322/99 |
| 8,552,757 B2 * | 10/2013 | Simon | 324/765.01 |
| 2003/0117144 A1 * | 6/2003 | Sutton | 324/546 |
| 2004/0000923 A1 | 1/2004 | Fischer et al. | |
| 2005/0072234 A1 * | 4/2005 | Zhu et al. | 73/579 |
| 2005/0184751 A1 * | 8/2005 | Hobelsberger et al. | 324/772 |
| 2006/0251200 A1 * | 11/2006 | Miller | 375/371 |

FOREIGN PATENT DOCUMENTS

| | | |
|---|---|---|
| EP | 0334541 A1 | 9/1989 |
| EP | 1318411 A2 | 6/2003 |
| WO | 0210737 A2 | 2/2002 |

* cited by examiner

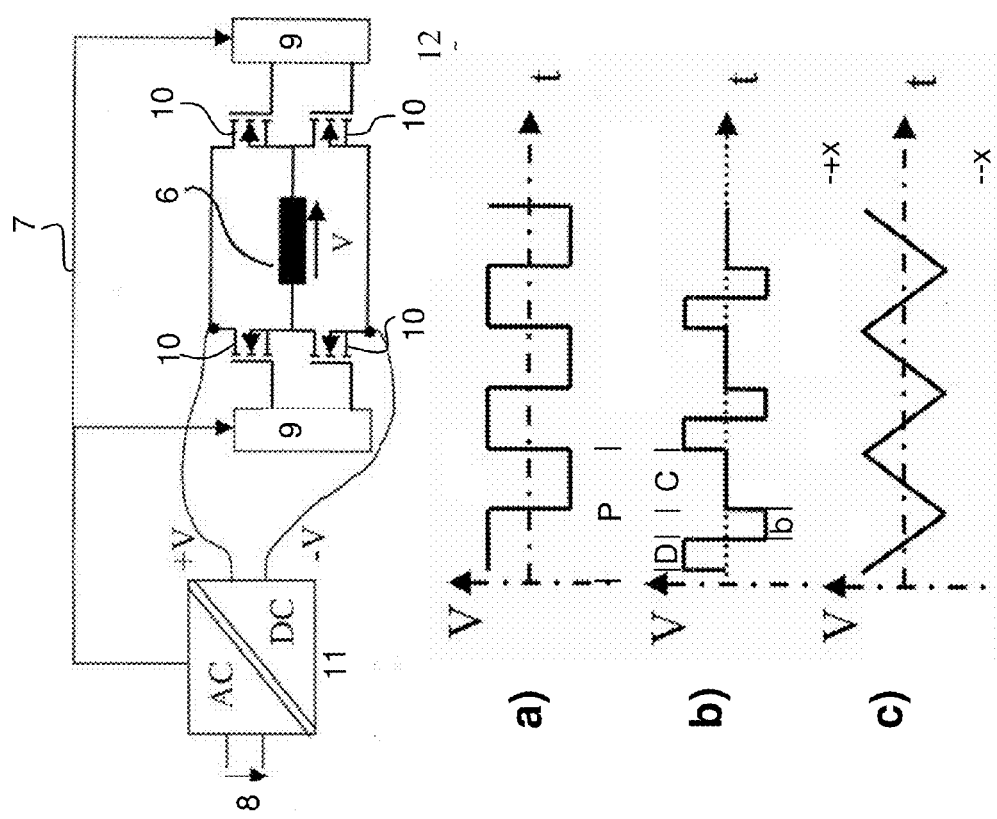

METHOD FOR DETECTION OF INTERLAMINAR SHEET SHORT CIRCUITS IN THE STATOR SHEET CORE OF ELECTROMACHINES

CROSS REFERENCE TO RELATED APPLICATIONS

This application is a continuation of International Patent Application No. PCT/EP2008/065714, filed Nov. 18, 2008, which designated the USA, and which claimed priority of Swiss Application No. 01894/07, filed Dec. 7, 2007, which are incorporated by reference as if fully set forth.

TECHNICAL FIELD

The present invention relates to a method for detection of interlaminar laminate shorts in the laminated stator core of electrical machines, in particular of large generators. The invention relates in particular to improving an apparatus and a method in which the laminated stator core is subjected to an externally applied field current or field voltage and the short-circuit magnetic field induced by short-circuit currents is measured with the assistance of a sensor coil which is arranged in the gap in the machine and probes this gap.

BACKGROUND

Large generators and motors are routinely examined for laminate shorts when stationary. Various methods are available for this purpose.

One of these methods comprises the magnetization of the entire laminated body by means of an auxiliary coil at the mains frequency, and the measurement of stray fields on the inner surface of the stator bore. The magnetization is carried out to relatively low values of the magnetic induction, typically to about 10% of the normal operating induction. This method of measurement is also known by the name "low-induction laminate short measurement" or by the name "ELCID" (electromagnetic core imperfection detector).

By way of example, U.S. Pat. No. 4,996,486 describes one method of this type. The prior art is therefore for the laminated stator core to be magnetized by means of an auxiliary coil and a sinusoidal auxiliary voltage applied thereto at the mains frequency, to about one tenth of the operating induction. This auxiliary voltage is normally derived directly from the mains voltage. An electrical recording coil is then moved away from the surface of the stator bore, with the recording coil being located close to the surface of the laminated core.

The currents which flow as a result of the interlaminar short circuits in the laminated core now induce voltages with a characteristic phase angle and amplitude magnitude in the recording coil. The characteristic phase angles and amplitudes make it possible to distinguish between points where there are laminate-short currents and points where there are no laminate-short currents. It is therefore possible to locate laminate shorts, and to assess the magnitude of the short-circuit currents, by means of this stray-field recording coil.

Furthermore, patent specification U.S. Pat. No. 6,903,556 proposes a system which operates with magnetization voltages at a frequency higher than the mains frequency.

The known methods have the disadvantage that it is often difficult to interpret the measurement results since the voltages induced by the laminate-short currents are generally very small. In particular, strong stray fields of the stator main field or losses in additional fields, which occur, for example, as a result of currents induced in short-circuited conductor loops can conceal the effect of the actual short-circuit current through the defective point, thus making detection more difficult.

This is particularly the case with small laminate defects which cause only small currents and have only a small magnetic effect. Disturbing additional fields occur particularly when testing hydrogenerators when the rotor has not been removed for testing, as a result of which the individual poles exert a magnetic effect.

According to U.S. Pat. No. 6,903,556, the reliability of the measurement can be increased by magnetizing the stator at a higher frequency. A sinusoidal AC voltage at a higher frequency is applied to the magnetization coil for this purpose. According to the "ELCID" measurement method, the so-called "magnetic potential differences" (MPD) are then determined. These are proportional to the respective electric currents which influence the field through the measurement coil. Since only a smaller magnetization current is required at a higher frequency to create the same short-circuit current through the defect point as in the case of magnetization at a lower frequency, the corresponding MPD component of the short-circuit current is greater in relation to the corresponding component of the field current than at a lower frequency, that is to say the measurement is more accurate and more sensitive. This measurement method has the disadvantage of the additional complexity required for the high-frequency generator for the field current. A further disadvantage is that it is necessary to work with precisely selected and known and/or measured values of the stator induction, since the measurement results are compared with absolute limit values and are then assessed.

DESCRIPTION OF THE INVENTION

The present invention relates to an improvement to the low-induction measurement method. The invention is accordingly based, inter alia, on the object of providing an improved method and an additional apparatus for detection of interlaminar laminate shorts in the laminated stator core of electrical machines. Specifically, it relates to the improvement of a method in which the laminated stator core is subjected to an externally applied field current or field voltage and the short-circuit magnetic field induced by short-circuit currents is measured with the assistance of a sensor coil which is arranged in the gap in the machine and probes this gap.

The improvement to this method is achieved by using a field current and a field voltage which have a waveform which differs significantly from a sinusoidal shape. In this case, a sinusoidal shape means a shape which is formed substantially from only a sine wave at a fundamental frequency. Superimposition of two sinusoidal shapes each at a different frequency (a fundamental frequency and a harmonic) is therefore, for example, a waveform which differs substantially from a sinusoidal shape.

The principle of the novel method is, inter alia, the knowledge that an input signal which is not in the form of a sine wave or cosine wave can be represented mathematically as a sum of sinusoidal signal components (Fourier series). These further signal components which are arranged at multiples of the fundamental frequency in the case of periodic signals are referred to as harmonics, individual harmonics or overtones.

A further principle of the novel method is, inter alia, the knowledge that, on the basis of system theory, a linear system reacts to an input signal in such a way that its output signal can in turn be split into precisely these harmonic individual components, with a defined transfer function existing. This function describes the phase and amplitude relationships between the input harmonics and the associated output harmonics, in which case the individual harmonics do not influence one another in the linear approximation.

A further principle is the knowledge that, up to a certain cut-off frequency, the electrical circuit of the laminate short circuit is primarily resistive. This means that the short-circuit current in this circuit depends, to a good approximation, only on the field voltage, but is influenced only to a minor extent by the field frequency. This situation also applies to the individual harmonics of the field signal. The field current itself decreases approximately linearly, however, as the frequency rises. These relationships are used to identify laminate short circuits.

In addition, a further principle is the knowledge that a generator still operates with relatively low losses, that is to say as a good transformer, up to medium frequencies of about 2 kHz, because of its lamination. This means on the one hand that the field current decreases substantially linearly up to higher frequencies, that is to say higher harmonics, but on the other hand the "useful voltage", that is to say the voltage induced by the laminate-short current in the measurement probe, rises linearly with the frequency. By way of example, the fifth harmonic therefore requires only ⅕ of the current of the fundamental in order to produce the same useful voltage.

Therefore, in other words, the essence of the invention is the unexpected discovery that the use of a field current or field voltage with a waveform which has substantial harmonic components, that is to say which is not sinusoidal, can be used particularly well for the proposed method. In this case, even though they have a decreasing amplitude in the spectrum of the field for increasing frequency, the higher harmonic components can be optimally used for identification of laminate shorts and for measurement of laminate shorts, because the voltage induced in the measurement probe behaves in the opposite manner, without having to expressly produce the high frequencies using a specific frequency generator.

A first preferred embodiment of the invention is correspondingly characterized in that the waveform of the field current or field voltage is a periodic waveform with significant higher harmonics. A periodic waveform such as this can be developed as a Fourier series, that is to say that a field signal can be broken down into a linear combination of sinusoidal components with frequencies at the integer multiples (harmonics) of the fundamental frequency of the periodic signal. In principle, within the scope of the present invention, a field voltage or field current shape is advantageous which has substantial components, that is to say substantial amplitudes at these harmonics. The amplitudes of the second to the tenth harmonics should preferably be in the same order of magnitude as the fundamentals, for example in the range 10%-300%. For example, a signal is preferred at which the harmonic amplitudes decrease substantially linearly, exponentially or quasi-linearly as the frequency rises.

The waveform of the field current or field voltage is preferably a trapezoidal function, a sawtooth function, a square-wave function or modified square-wave function. As is known from Fourier theory, functions which have sharp edges, in particular, have substantial overtones. A preferred shape is appropriate when the waveform of the field current or field voltage is a symmetrical square-wave function with positive and negative sections of the same length, preferably without any further sections, for example zero sections.

A further preferred embodiment to the method is characterized in that the periodic waveform of the field current or field voltage has a fundamental frequency in the range 10-500 Hz, in particular preferably in the range 40-100 Hz. The mains frequency of 50 Hz or 60 Hz is typically used. In order to avoid disturbances in measurement, it has been found to be advantageous for the fundamental frequency of the periodic waveform to be synchronized to the mains voltage used for the field.

A further embodiment of the invention is characterized in that measurement and evaluation are carried out on the basis of the phase angle, defined as the difference between the output phase angle and the input phase angle of the individual harmonics of the field current or field voltage. The (variation in the) transfer function can thus preferably be evaluated for each harmonic, to be precise with regard to amplitude and with regard to phase. In this case, the substantially linear relationship between the phase angle and frequency can be used for identification of laminate shorts.

A further preferred embodiment is distinguished in that the signal recorded in the sensor coil is subjected to spectral analysis with the assistance of a Fourier transformation for identification of laminate shorts. In this case, preferably, the phase spectrum of the various harmonics is used for identification of laminate shorts.

According to a further preferred embodiment, first of all, prior to the measurement, or after it, the measurement apparatus is calibrated by means of a conductor loop, which is arranged on the bore surface, and a calibration current, which flows through this loop of a known magnitude and contains substantially the same harmonics as the waveform of the field current or field voltage during the actual measurement, wherein, in particular and preferably, the same waveform is used for calibration as for measurement.

A combined current/voltage analysis can preferably be carried out for identification of laminate shorts, preferably taking account of the, in particular, falling, phase angle as a function of rising frequency.

The use of a periodic waveform for the field current or field voltage has been described above. However, it is also possible to provide a non-periodic field. For example, a further embodiment is characterized in that substantially a single pulse, in particular and preferably a square-wave pulse, is applied as the waveform of the field current or field voltage or a sequence of pulses which are evaluated independently of one another and are averaged overall, is in each case used for a measurement at a specific point.

Measurement and evaluation of laminate shorts can therefore be carried out on the basis of the phase angles and amplitudes in the individual harmonics. The phase angles and amplitudes of the harmonics can for this purpose be analyzed by means of Fourier analysis. In this case, it is preferable to assess a spatially simultaneous change in the phase angles of a plurality of harmonics as an indication of a laminate short circuit.

A substantially linear relationship between changes in the phase angle and frequency of the harmonics can also be assessed as an indication of a laminate short.

The present invention furthermore relates to an apparatus for carrying out a method as has been described above. The apparatus is preferably characterized in that a sensor coil is arranged, as well as a field apparatus for production of a field voltage or a field current in the laminated core, wherein a frequency generator is additionally provided in order to operate the field apparatus, and is designed to operate the field apparatus with a field current or a field voltage with a waveform which differs substantially from a sinusoidal shape.

An apparatus such as this can preferably be characterized in that the frequency generator is an electronic full bridge.

A field coil can preferably be used, possibly in combination with a field yoke, for excitation.

Further preferred embodiments of the invention are described in the dependent claims.

BRIEF DESCRIPTION OF THE DRAWINGS

The invention will be explained in more detail in the following text with reference to exemplary embodiments and in conjunction with the drawings, in which:

FIG. 4 shows a full bridge for producing the field voltage;

FIG. 5 shows various pulse sequence shapes, wherein a) illustrates a periodic symmetrical square-wave function, b) illustrates a modified square-wave function, and c) illustrates a sawtooth function;

APPROACHES TO IMPLEMENTATION OF THE INVENTION

Figure 2:
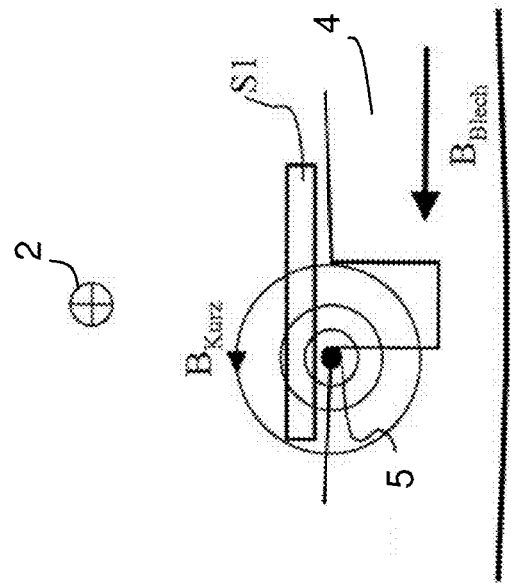
FIG. 2 shows a cross section through a laminated stator core.

As already explained in the introduction, and once again in the same way as conventional ELCID methods, the novel method works with a low-induction field and a measurement coil for measuring the stray field. However, it is distinguished in particular by the stator being magnetized by non-sinusoidal (or co-sinusoidal with a phase shift) signal waveforms of the field voltage.

Typically and particularly, the invention makes use, for example, of a square-wave, trapezoidal, sawtooth or generally pulsed field voltage. The period p of this field voltage may correspond to the period of the main voltage, or else may differ from it, for example may be less. It is also possible to use non-periodic voltage waveforms, for example individual pulses, for the field.

In general, in this case, a square-wave field voltage V (see also FIG. 5*a*) means a waveform for which:

$V(t) = +x$ for $0 \leq t < p/2$;

$V(t) = -x$ for $p/2 \leq t < p$, and a trapezoidal or triangular-waveform field voltage V (cf. also FIG. 5*c*) means, for example, a waveform for which:

$V(t) = 4 \times t/p$ for $0 \leq t < p/4$;

$V(t) = 4 \times (½ - 1/p)$ for $p/4 \leq t < 3p/4$;

$V(t) = 4 \times (t/p - ¾)$ for $3p/4 \leq t < p$ (asymmetric splits, etc., are also possible);
while a sawtooth-waveform field voltage V is, for example, a waveform for which:

$V(t) = 2 \times (½ - 1/p)$ for $0 \leq t < p$.

Generalized forms of these functions are also possible, for example a square-wave function with a zero section c (cf. FIG. 5*b*).

Mixed forms of the waveforms and shapes mentioned above are equally possible which correspond only substantially to the mathematically formulated waveforms mentioned above (rounded flanks, etc., because of the technical implementation).

These non-sinusoidal voltages V(t) can be produced using relatively simple means, for example simply by switching between a positive and a negative voltage level. This makes it possible to design lightweight, robust and reliable field devices.

Furthermore, the novel method is distinguished in that both the fundamental and the harmonics of the signal produced by the measurement coil are evaluated. This evaluation is typically carried out in the form of a harmonic analysis both of the measurement signal and of the field signal. Phase information and amplitude information relating to the individual harmonics are used for detection of laminar short circuits. In this case, harmonic analysis uses Fourier transformation means, for example the "Fast Fourier Transformation/FFT" algorithms.

However, the evaluation can also be carried out in the time domain, wherein characteristic changes in the waveforms of the measurement voltage are then assessed in comparison to the field voltage.

Furthermore, the novel method is preferably distinguished in that the transfer function between the field signal and the measurement signal is also used in an extended frequency range for reliable identification of laminate short circuits.

The low power consumption for the field with good sensitivity may be mentioned as a particular advantage. In particular, the pulsed field makes it possible on the one hand for the direct-axis voltage to be of an order of magnitude in the range of the normal operating voltage/operating induction.

On the other hand, small handheld devices may be constructed which allow measurements at points where access is difficult.

The principle of the novel method, as already explained in the introduction, is the knowledge that a non-sinusoidal (periodic) input signal can be represented mathematically as a sum of sinusoidal signal components (as a Fourier series in the case of a periodic signal, and as a Fourier spectrum in the case of a non-periodic signal), and that a linear system (and the system to be analyzed here reacts substantially as such a linear system) reacts to this input signal in such a way that its output signal can in turn be split into precisely these harmonic individual components, with a defined transfer function existing. This function describes the phase and amplitude relationships between input harmonics and associated output harmonics (for periodic signals, the components at integer multiples of the fundamental frequency), in which case the individual harmonics do not influence one another in the system which is considered to be linear.

A further principle is the knowledge that, up to a certain cut-off frequency, the electrical circuit of the laminate short circuit is substantially resistive. This means that the short-circuit current in this circuit depends to a good approximation only on the field voltage, but is influenced only to a minor extent by the field frequency. This situation also applies to the individual harmonics of the field signal. The field current itself, in contrast to this, decreases approximately linearly as the frequency rises. These relationships are used to identify laminate short circuits.

Furthermore, a further principle is the knowledge that a generator still operates with relatively low losses, that is to say as a good transformer, up to medium frequencies of about 2 kHz, because of its lamination. This means on the one hand that the field current amplitude decreases substantially linearly up to higher frequencies, that is to say higher harmonics, while on the other hand the "useful voltage", that is to say the voltage induced by the laminate-short current in the measurement probe, rises substantially linearly with the frequency.

Therefore, for example, the fifth harmonic requires only ⅕th of the current of the fundamental, in order to produce the same useful voltage.

Figure 1:
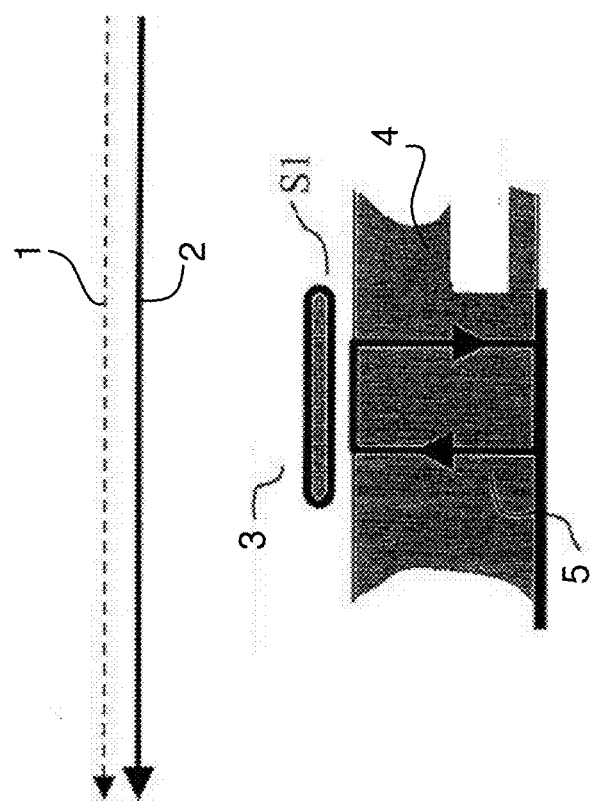
FIG. 1 shows a longitudinal section through a laminated stator core.

In order to illustrate the general measurement method, FIG. 1 shows the sensor coil S1 in cross section 3 and the laminated core 4 in the form of a longitudinal section (along the rotor axis 1), with the laminate plane being normal to the plane of the figure. The sensor coil S1 is arranged above the laminated core 4 in the gap in the machine. A laminate short circuit results in the applied periodic field current 2 inducing a short-circuit current 5 in the laminated core 4.

FIG. 2 shows the same arrangement, but as a section transversely with respect to the rotor axis 1, and this figure shows how the short-circuit current, in the laminate short circuit in the peripheral area, that is to say at the junction to the gap, induces the magnetic field $B_{short}$ and how this then induces a signal in the coil S1. Furthermore, this figure also shows how the field current 2 produces the magnetic field $B_{laminate}$ in the laminated core 4.

Figure 3:
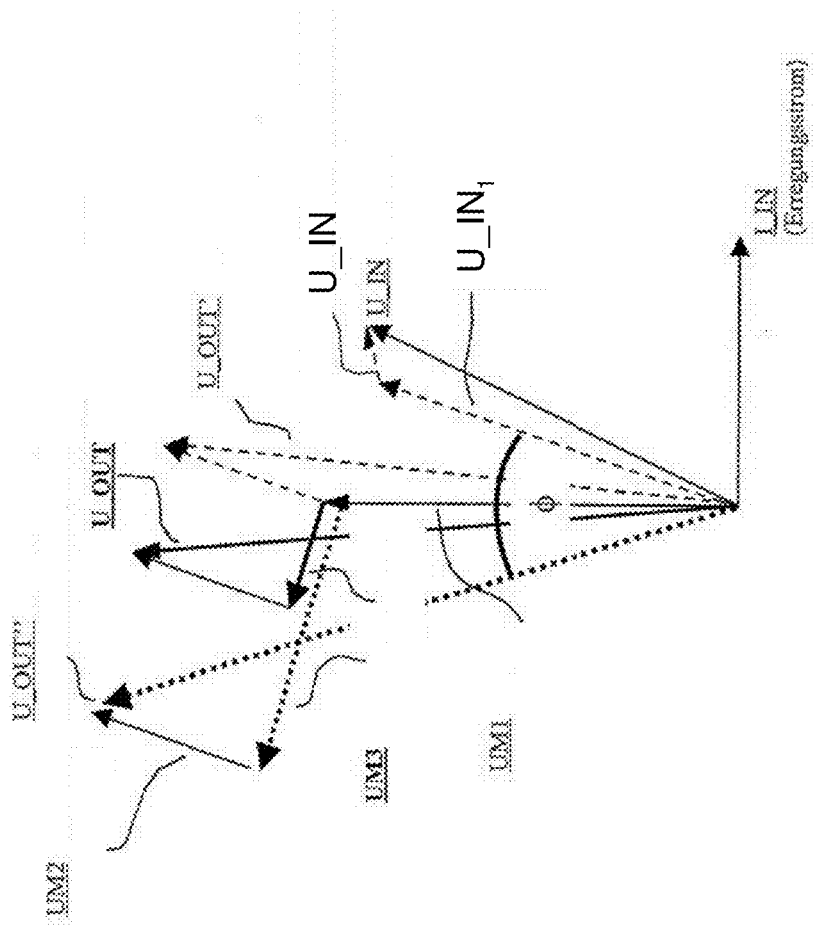
FIG. 3 shows a vector diagram for conditions at different frequencies.

FIG. 3 shows a vector diagram of the currents and voltages, showing the vectorial splitting of the measurement voltage U_OUT induced in the sensor coils S1 (measurement voltage with laminate short circuit). This voltage U_OUT can be split into three main components:

One component is induced directly by the field current or the field linked to it (UM1), another (UM2) is created by the stray field of the stator main field, and the third component (UM3) is induced by the field of the short-circuit current.

To a good approximation, the following statements can be made with regard to the frequency dependency:

UM1, which is induced directly by the field current, remains substantially constant as the frequency rises. UM1 is directly proportional to the field current and to the frequency (unloaded measurement coil, that is to say voltage measurement coil). The voltage admittedly rises linearly with the frequency, but the field current falls linearly; UM1 therefore remains substantially constant. For clarity reasons, this vector is illustrated as being independent of frequency in FIG. 3.

UM2 likewise remains substantially constant if the field voltage is constant.

UM3 rises substantially linearly with the frequency. This is because the short-circuit current in the laminate short circuit remains approximately constant if the field voltage is constant, and the measurement coil is operated with virtually no load as a voltage measurement coil, that is to say measures the rate of change of the current and of the field flux.

For the sake of completeness, the input field voltage is represented as U_IN, and is composed of two components, specifically U_IN1 and U_IN2.

A situation without a laminate short circuit correspondingly results in a measurement voltage U_OUT', which differs from U_OUT in respect of the amplitude, but in particular with respect to the phase φ.

For a higher harmonic, that is to say a higher frequency, this results in the situation which is represented by the resultant U_OUT".

As can be seen just from this vector representation, precisely the comparison between the measurement at the fundamental frequency (U_OUT) and a higher frequency (for example the first harmonic at twice the frequency) is very highly influenced by the laminate short circuit both in terms of amplitude and in particular in terms of phase, this correspondingly allowing clear identification thereof.

In summary form, this specifically means that the individual harmonics are distinguished in their vector representation, on the basis of harmonic analysis of the output voltage, mainly in the component UM3 when the amplitudes are normalized with respect to the input harmonics, that is to say when the magnitudes of the individual input vectors are matched to one another. This knowledge now allows the following evaluation methods and apparatuses used for this purpose:

The stator core is energized with a non-sinusoidal input voltage, for example a periodic pulse sequence with the mains period and with square-wave pulses (or other pulse sequences and shapes mentioned above). The pulses are preferably synchronized to the mains voltage in order to avoid interference in the measurement. The period of the pulse sequence may also differ from the mains period, for example by being only one third of the mains period.

A power stage fitted with switches is advantageously used to produce the field voltage. By way of example, an apparatus such as this is illustrated in FIG. 4, in which case the mains voltage 8 is first of all rectified in a rectifier and is then switched via controllable switching elements 10, in the form of a full bridge, to the desired waveform for the field voltage V, which is then applied to the field coil 6. In addition, a controller 9 is provided which allows synchronization 7 to the mains frequency of the mains voltage 8. The power stage can also operate at very high switching frequencies, with the desired output voltage being produced in the normal way by means of pulse-width modulation or pulse-frequency modulation. FIG. 5 shows various pulse shapes, as have already been discussed further above. On the one hand, FIG. 5a) shows a square-wave function, with the period p and an amplitude +/−x. The square-wave function illustrated here is symmetrical. However, asymmetric shapes are also feasible as well as shapes in which, for example, the period is not constant but increases or decreases successively (sweep), and, in general, shapes with frequency modulation are feasible.

FIG. 5b) illustrates a generalized square-wave function, and in this case the waveform in each case comprises not only a positive section a and a negative section b but also a zero section c. Mixed shapes and variations are likewise possible, in a sensible form whenever substantial harmonics, which can be evaluated according to the invention, are present in a signal such as this.

FIG. 5c) illustrates a triangular-waveform function, which may also be distorted, in a possible limit case as far as a sawtooth-waveform function.

Measurement and evaluation of the phase angles of the difference between the output phase angle and the input phase angle of the individual harmonics: the phase angles of the individual harmonics will rise linearly with the frequency at the location of the laminate short circuit. For example, the phase angle of the fifth harmonic (for example 250 Hz with a fundamental frequency of 50 Hz) will have a value corresponding to approximately five times the phase angle of the fundamental. At points without a laminate short, the phase angles of the individual harmonics will differ little from one another. this approximately linear relationship between the phase angle and frequency, in particular, can be used to identify laminate shorts. The normal phase diagram (the "phase spectrum") of the FFT spectral analysis is advantageously used for this purpose. A voltage which is derived directly from the core induction, for example derived by means of a measurement loop which is passed around the stator core and through the bore, is advantageously used as a reference voltage for measurement and calculation of the phase angle.

Representation of the phase angles of the individual harmonics as "trends", for example in a single figure, as sets of lines arranged one above the other, as a function of the axial position of the measurement coil. For this purpose, the probe is moved along the inner surface of the laminated core in the axial direction, in the normal manner, for the measurement.

Representation of the individual vectors of the harmonics in polar coordinates—diagram based on magnitude and phase angle, once again showing a multiplicity of measurement points recorded at different locations. Once again, amplitude normalization is advantageously carried out, that is to say the lengths of the individual vectors are matched to one another by suitable multiplication. The vectors of the harmonics can also be placed one above the other, by rotation, for evaluation.

Calibration of the measurement apparatus by means of a conductor loop arranged on the bore surface and by means of a calibration current of known magnitude flowing through this loop, which calibration current contains the respective harmonics, for example using an approximately square-wave calibration current. This calibration current is advantageously synchronized to the magnetization signal. The calibration is used to find the relationship that exists between the amplitude of the calibration current harmonics and the magnitude of the phase difference in comparison to a measurement without a calibration current. The phase distortion of the calibration current is therefore measured.

Evaluation of the measurement signals in the time domain: because of the differentiating effect of the measurement coil with respect to the laminate short circuit, it is also possible to distinguish between locations with laminate shorts and locations without laminate shorts in the time domain. For example, a triangular-waveform or ramp pulse sequence (inverse sawtooth) as a field voltage may result in a measurement voltage which somewhat leads the field voltage in time at the zero crossings, since a ramp pulse sequence is now present which has a square-wave signal superimposed on it, etc.

Figure 6:
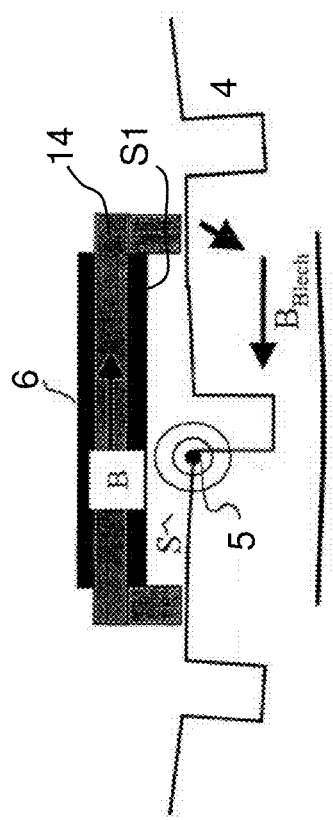
FIG. 6 shows a cross section through a situation with a local field.

The field can also be produced only locally. By way of example, as is shown in FIG. 6, an iron yoke 14 is arranged for this purpose above the (air-cored) measurement coil S1, and surrounds the measurement coil S1 in the form of a bracket. The measurement coil S1 can also be wound co-axially with the field coil onto the yoke 14, or the measurement coil and the field coil 6 may be in the form of a single coil. In the case of a single coil, which is used as a measurement coil and field coil at the same time, a combined current/voltage analysis must preferably be carried out. In this case, a laminate short circuit is characterized by additional losses which remain approximately constant as the frequency rises and for normalized amplitudes of the harmonics, that is to say the phase angle between the input voltage and the input current of the respective harmonics falls as the frequency rises in comparison to the corresponding phase angle at locations where there is no defect. The amplitude of the field current in fact falls as the frequency rises. Magnetically permeable rollers, for example composed of ferrite material embedded in plastic, can be used for magnetically permeable connection to the stator iron body.

Figure 7:
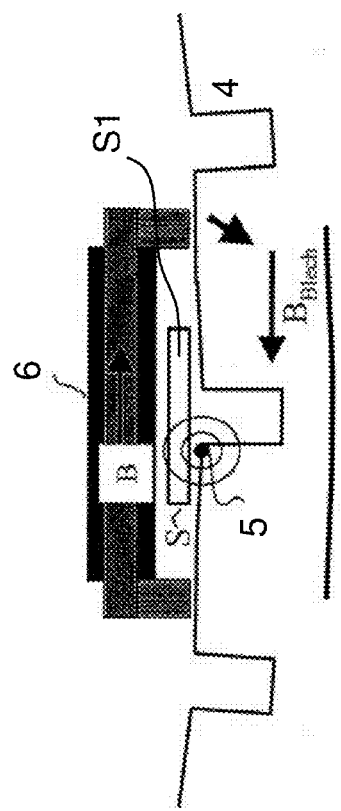
FIG. 7 shows a cross section through a situation with a separately arranged measurement and field coil.

A separate arrangement comprising a broader field yoke 14 with a field coil 6 and a narrow measurement coil S1 as shown in FIG. 7 has the advantage that the defect can be located better using a relatively narrow measurement coil.

In summary, the following general advantages and features, which are significant to the invention either individually or in combination, can be stated:

that a non-sinusoidal field voltage is used for magnetically energizing the stator core;

that this voltage may be a periodic pulse sequence or may consist of non-periodic pulses;

that the phase angles and the amplitudes of the individual harmonics of the measurement voltage are used for detection of the laminate shorts;

that the phase angles and amplitudes of the harmonics are determined by means of Fourier analysis;

that the phase spectrum is preferably used for evaluation to detect a laminate short;

that a spatially simultaneous change in the phase angles of a plurality of harmonics is assessed as an indication of a laminate short circuit;

that an approximately linear relationship between changes in the phase angles and frequency of the harmonics is assessed as an indication of a laminate short;

that an electronic full bridge is used to produce the field voltage;

that the field is produced locally by means of a field yoke;

that the field is produced in a pulsed form with direct-axis voltages in the region of the operating direct-axis voltage.

LIST OF REFERENCE SYMBOLS

1 Rotor axis direction
2 Field current
3 Cross section through the sensor coil
4 Laminated core in the stator
5 Short-circuit current
6 Field coil
7 Synchronization
8 Mains voltage
9 Controller
10 Semiconductor switching elements
11 Rectifier
12 Inverter
13 Field coil and sensor
14 Field yoke
S1 Sensor coil
$B_{short}$ Magnetic field induced by the peripheral waveform of 5
$B_{laminate}$ Magnetic field induced in the laminated core
$\phi$ Phase angle
UM1 Component induced by the field current
UM2 Component induced by the stray field of the stator main field
UM3 Component induced by the field of the short-circuit current Bshort
U_OUT Measurement voltage induced in the sensor coils
U_OUT' U_OUT when there is no laminate fault
U_OUT" U_OUT for a higher-frequency situation
U_IN Input field voltage
I_IN Field current, also annotated with reference symbol 2
$U\_N_1$ Component of U_IN, voltage induction iron core (core losses: eddy current, remagnetization etc.)
$U\_IN_2$ Component of U_IN, voltage-component-resistive cable losses and stray field
V Field voltage applied to the field coil
p Period of V
a Positive section of V
b Negative section of V
c Neutral section of V

The invention claimed is:

1. A method for detection of interlaminar laminate shorts in a laminated stator core of electrical machines, the method comprising;

subjecting the laminated stator core to an externally applied field current or field voltage;

measuring, with a sensor coil, a short-circuit magnetic field induced by short-circuit currents the sensor coil being arranged in a gap in a machine and probes the gap, wherein the field current and field voltage have a non-sinusoidal shaped waveform, and the non-sinusoidal shaped waveform of the field current or field voltage is a periodic waveform with significant higher harmonics; and evaluating both a fundamental frequency and a harmonic of a signal produced by the sensor coil, subjecting the signal recorded in the sensor coil to spectral analysis with assistance of a Fourier transformation for identification of the interlaminar laminate shorts, and using a phase spectrum of various harmonics for identification of the interlaminar laminate shorts on a basis of phase angles in individual harmonics of the various harmonics.

2. The method as claimed in claim 1, wherein the waveform of the field current or field voltage is a non-periodic pulse function.

3. The method as claimed in claim 1, wherein the field current is chosen such that an operating direct-axis voltage is at least briefly reached.

4. The method as claimed in claim 1, wherein the waveform of the field current or field voltage is a sawtooth function, a square-wave function or a modified square-wave function.

5. The method as claimed in claim 1, wherein the waveform of the field current or field voltage is a symmetrical square-wave function with positive and negative sections of a same length.

6. The method as claimed in claim 5, further comprising synchronizing the fundamental frequency to a mains voltage used for a field.

7. The method as claimed in claim 1, wherein the waveform of the field current or field voltage has a fundamental frequency in the rang 10-500 Hz.

8. The method as claimed in claim 1, further comprising carrying out measurement and evaluation on the basis of the phase angle, defined as the difference between an output phase angle and an input phase angle of the individual harmonics of the field current or field voltage.

9. The method as claimed in claim 8, further comprising using a substantially linear relationship between the phase angle and frequency to identify laminate shorts.

10. The method as claimed in claim 1, further comprising calibrating the measurement apparatus by means of a conductor loop, which is arranged on a bore surface, and a calibration current, which flows through this conductor loop of a known magnitude and contains substantially a same harmonics as the waveform of the field current or field voltage during the actual measurement, wherein the same waveform is used for calibration as for measurement.

11. The method as claimed in claim 1, further comprising carrying out a combined current/voltage analysis to identify laminate shorts, taking account of falling phase angle as a function of rising frequency.

12. The method as claimed in claim 1, further comprising applying a single pulse as the waveform of the field current or field voltage or a sequence of pulses which are evaluated independently of one another and are averaged overall, is in each case used for a measurement at a specific point.

13. The method as claimed in claim 1, further comprising using measurement and evaluation of laminate shorts on the basis of the phase angles and amplitudes in the individual harmonics.

14. The method as claimed in claim 1, further comprising analyzing the phase angles and amplitudes of the harmonics by means of Fourier analysis.

15. The method as claimed in claim 1, further comprising assessing a spatially simultaneous change in the phase angles of a plurality of harmonics as an indication of a laminate short circuit.

16. The method as claimed in claim 1, further comprising assessing a substantially linear relationship between changes in the phase angle and frequency of the harmonics as an indication of a laminate short.

17. The method as claimed in claim 1, wherein the laminated stator core is subjected to the field voltage, and the field voltage is produced by a power stage fitted with switches.

18. An apparatus for carrying out a method for detection of interlaminar laminate shorts in a laminated stator core of electrical machines, in which the laminated stator core is subjected to an externally applied field current or field voltage, and a short-circuit magnetic field induced by short-circuit currents is measured by a sensor coil which is arranged in a gap in a machine and probes the gap, wherein the field current and field voltage have a non-sinusoidal shaped waveform, the apparatus comprising;

a sensor coil is arranged in the laminated stator core;

a field apparatus for production of a field voltage or a field current also arranged in the laminated stator core;

and a frequency generator provided in order to operate the field apparatus, and is configured to operate the field apparatus with a field current or a field voltage with a non-sinusoidal shaped waveform, and the non-sinusoidal shaped waveform of the field current or field voltage is a periodic waveform with significant higher harmonics, wherein both a fundamental frequency and a harmonic of a signal produced by the sensor coil are evaluated, the signal recorded in the sensor coil is subjected to spectral analysis with assistance of a Fourier transformation for identification of the interlaminar laminate shorts, and a phase spectrum of various harmonics is used for identification of the interlaminar laminate shorts on a basis of phase angles in individual harmonics of the various harmonics.

19. The apparatus as claimed in claim 18, wherein the frequency generator is an electronic full bridge.

20. The apparatus as claimed in claim 18, further comprising a field coil used, in combination with a field yoke, for energizing.

21. The apparatus as claimed in claim 18, wherein the laminated stator core is subjected to the field voltage, and the field voltage is produced by a power stage fitted with switches.

* * * * *